(12) United States Patent
Kobayashi (10) Patent No.: US 12,068,434 B2
(45) Date of Patent: Aug. 20, 2024

(54) SEMICONDUCTOR DEVICE AND SEMICONDUCTOR UNIT (71) Applicant: SONY SEMICONDUCTOR SOLUTIONS CORPORATION, Kanagawa (JP)

(72) Inventor: Tatehito Kobayashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 299 days.

(21) Appl. No.: 17/430,392

(22) PCT Filed: Feb. 7, 2020

(86) PCT No.: PCT/JP2020/004789
§ 371 (c)(1),
(2) Date: Aug. 12, 2021

(87) PCT Pub. No.: WO2020/170855
PCT Pub. Date: Aug. 27, 2020

(65) Prior Publication Data
US 2022/0149235 A1  May 12, 2022

(30) Foreign Application Priority Data
Feb. 19, 2019 (JP) .................. 2019-027481

(51) Int. Cl.
H01L 21/00 (2006.01)
H01L 25/13 (2006.01)
H01L 33/20 (2010.01)
H01L 33/62 (2010.01)

(52) U.S. Cl.
CPC .............. *H01L 33/20* (2013.01); *H01L 25/13* (2013.01); *H01L 33/62* (2013.01)

(58) Field of Classification Search
CPC .......... H01L 33/20; H01L 25/13; H01L 33/62
See application file for complete search history.

(56) References Cited

FOREIGN PATENT DOCUMENTS

JP  2002-118208  4/2002
JP  2004-304081  10/2004

OTHER PUBLICATIONS

International Search Report prepared by the Japan Patent Office on Mar. 10, 2020, for International Application No. PCT/JP2020/004789.

*Primary Examiner* — Richard A Booth
(74) *Attorney, Agent, or Firm* — Sheridan Ross PC (57) ABSTRACT A first semiconductor device of an embodiment of the present disclosure includes: a semiconductor substrate having one surface and another surface opposed to each other, and having a side length of 50 μm or more and 500 μm or less; a single or multiple bumps provided on the other surface; and a projection-and-depression structure formed in a side surface of the semiconductor substrate.

14 Claims, 10 Drawing Sheets

S101
PERFORM BONDING

S102
FORM BUMP

S103
PERFORM SINGULATION AND FORM GROOVE

S104
PERFORM MOUNTING

SEMICONDUCTOR DEVICE AND SEMICONDUCTOR UNIT

CROSS REFERENCE TO RELATED APPLICATIONS

This application is a national stage application under 35 U.S.C. 371 and claims the benefit of PCT Application No. PCT/JP2020/004789 having an international filing date of 7 Feb. 2020, which designated the United States, which PCT application claimed the benefit of Japanese Patent Application No. 2019-027481 filed 19 Feb. 2019, the entire disclosures of each of which are incorporated herein by reference.

TECHNICAL FIELD

The present disclosure relates to a semiconductor device to be mounted on a substrate by using a bump, and a semiconductor unit including the semiconductor device.

BACKGROUND ART

In chip mounting by flux reflow, the chip sinks into the flux under its own weight, causing a solder on a chip side and an under bump metal (UBM) on a substrate side to come into contact with each other. By being heat-treated in that state, the solder on the chip side and the UBM on the substrate side are fusion-coupled to each other. For example, PTL 1 discloses a semiconductor unit in which a bond strength between the chip and the substrate is enhanced by providing an end face of the chip with a projection-and-depression pattern to improve a bond strength to a resin fillet.

CITATION LIST

Patent Literature

PTL 1: Japanese Unexamined Patent Application Publication No. 2004-304081

SUMMARY OF THE INVENTION

Meanwhile, in a case of mounting a fine chip by flux reflow, faulty coupling tends to occur to result in a reduction in manufacturing yield. For this reason, improvement in manufacturing yield is demanded.

It is desirable to provide a semiconductor device and a semiconductor unit that make it possible to improve the manufacturing yield.

A first semiconductor device of an embodiment of the present disclosure includes: a semiconductor substrate having one surface and another surface opposed to each other, and having a side length of 50 μm or more and 500 μm or less; a single or multiple bumps provided on the other surface; and a projection-and-depression structure formed in a side surface of the semiconductor substrate.

A first semiconductor unit of an embodiment of the present disclosure is a unit in which multiple semiconductor devices are mounted on a mounting substrate, and which includes, as the multiple semiconductor devices, the first semiconductor devices of the embodiment described above.

A second semiconductor device of an embodiment of the present disclosure includes: a semiconductor substrate having one surface and another surface opposed to each other; a single or multiple bumps provided on the other surface; and a projection-and-depression structure formed by dry etching in a side surface of the semiconductor substrate.

A second semiconductor unit of an embodiment of the present disclosure is a unit in which multiple semiconductor devices are mounted on a mounting substrate, and which includes, as the multiple semiconductor devices, the second semiconductor devices of the embodiment described above.

According to the first semiconductor device of the embodiment, the first semiconductor unit of the embodiment, the second semiconductor device of the embodiment, and the second semiconductor unit of the embodiment of the present disclosure, the projection-and-depression structure is formed by dry etching in the side surface of the semiconductor substrate in which a semiconductor element is provided. This increases a surface tension on the side surface of the semiconductor substrate.

MODES FOR CARRYING OUT THE INVENTION

In the following, an embodiment of the present disclosure will be described in detail with reference to the drawings. The following description is a specific example of the present disclosure, and the present disclosure is not limited to the following embodiment. Further, the present disclosure does not limit the disposition, dimensions, dimension ratios, and the like of components illustrated in the drawings thereto. It is to be noted that the description is given in the following order.
1. Embodiment (an example of a semiconductor device in which grooves are provided in a side surface of a chip substrate)
    1-1. Configuration of Semiconductor Device
    1-2. Method of Manufacturing Semiconductor Device
    1-3. Configuration of Semiconductor Unit
    1-4. Workings and Effects
2. Modification Example (an example of a semiconductor device in which a hydrophilic treatment is further performed on the side surface of the chip substrate)

1. Embodiment (1-1. Configuration of Semiconductor Device)

Figure 1:
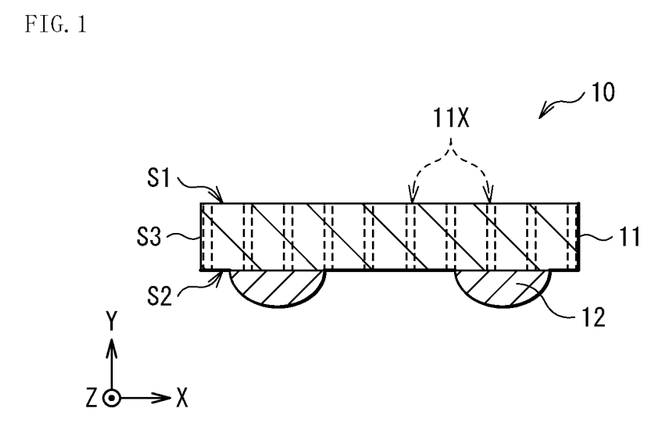
FIG. 1 is a schematic cross-sectional diagram illustrating an example of a semiconductor device according to an embodiment of the present disclosure.
Figure 2:
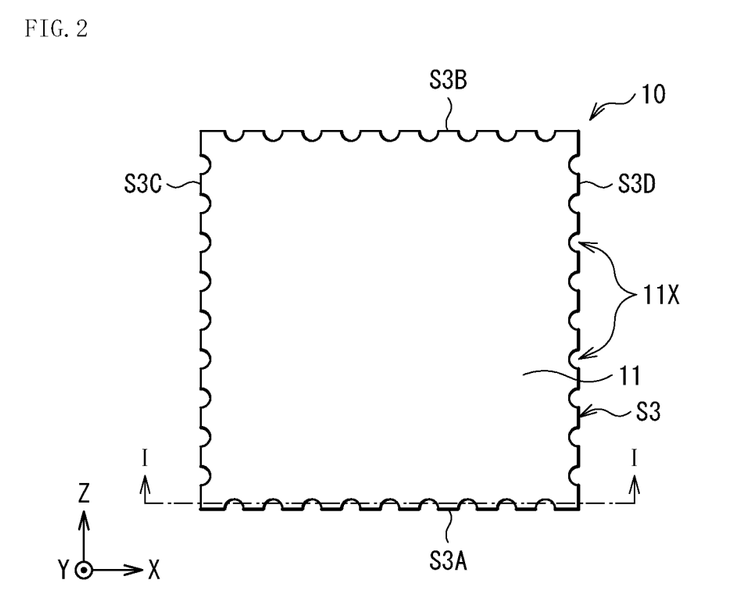
FIG. 2 is a schematic planar diagram of the semiconductor device illustrated in FIG. 1.

FIG. 1 illustrates a cross-sectional configuration of a semiconductor device (a semiconductor device 10) according to an embodiment of the present disclosure. FIG. 2 illustrates a planar configuration of the semiconductor device 10 illustrated in FIG. 1. It is to be noted that in FIG. 1, a cross section taken along line I-I indicated in FIG. 2 is illustrated. The semiconductor device 10 is a device which has a single or multiple bumps 12 on a surface S2 of a semiconductor substrate 11 having one surface (a surface S1) and another surface (the surface S2) opposed to each other, and in which multiple grooves 11X are further formed as a projection-and-depression structure in a side surface (a surface S3) of the semiconductor substrate 11. It is to be noted that FIGS. 1 and 2 schematically illustrate the configuration of the semiconductor device 10, and the illustrated size and shape may be different from actual ones.

The semiconductor device 10 is a semiconductor chip having a side length of 50 μm or more and 500 μm or less, more specifically, a side length of 80 μm or more and 200 μm. The semiconductor device 10 is, for example, an LED chip that is suitably used as a display pixel of an image display unit that is a so-called LED (Light Emitting Diode) display. The LED chip corresponds to a specific example of a "semiconductor device" of the present disclosure. The semiconductor device 10 is provided with, as described above, the multiple grooves 11X in the side surface (the surface S3) of the semiconductor substrate 11.

While a detailed description will be given later, the multiple grooves 11X are for assisting the bump 12 and an electrode 22 on side of a mounting substrate 20 in coming into contact with each other at the time of mounting onto the mounting substrate 20 by flux reflow (for example, see FIG. 5E). As illustrated in FIG. 1, for example, the multiple grooves 11X are provided in the side surface (the surface S3) of the semiconductor substrate 11. This increases a surface area of the semiconductor device 10 and facilitates contact between the bump 12 of the semiconductor device 10 and the electrode 22 for mounting on side of the mounting substrate 20 at the time of the flux reflow. It is to be noted that an antioxidation film 23 including, for example, gold (Au) plating, is provided on the electrode 22.

Figure 3A:
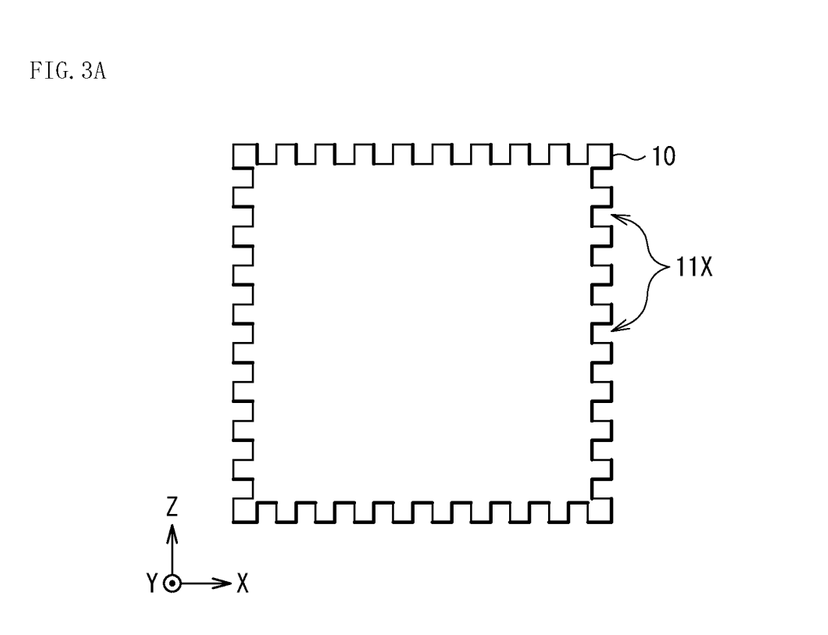
FIG. 3A is a schematic planar diagram illustrating another example of the semiconductor device illustrated in FIG. 1.
Figure 3B:
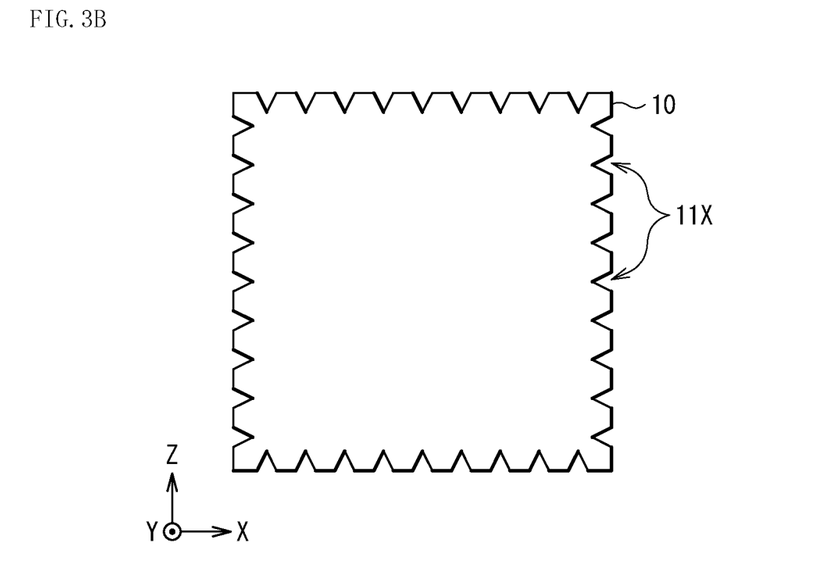
FIG. 3B is a schematic planar diagram illustrating another example of the semiconductor device illustrated in FIG. 1.
Figure 3C:
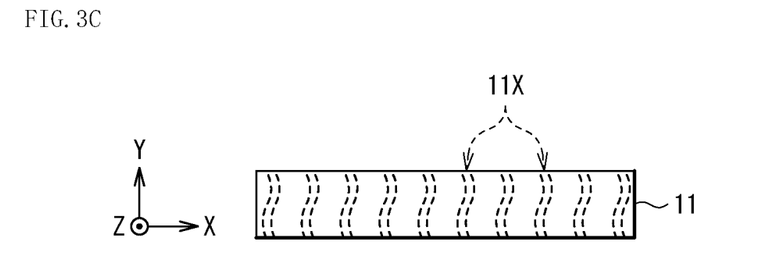
FIG. 3C is a schematic planar diagram illustrating another example of the semiconductor device illustrated in FIG. 1.
Figure 3D:
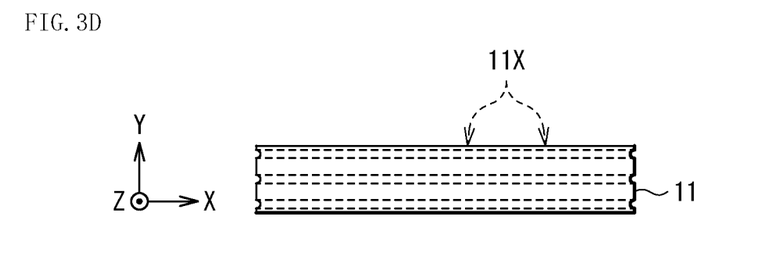
FIG. 3D is a schematic planar diagram illustrating another example of the semiconductor device illustrated in FIG. 1.
Figure 3E:
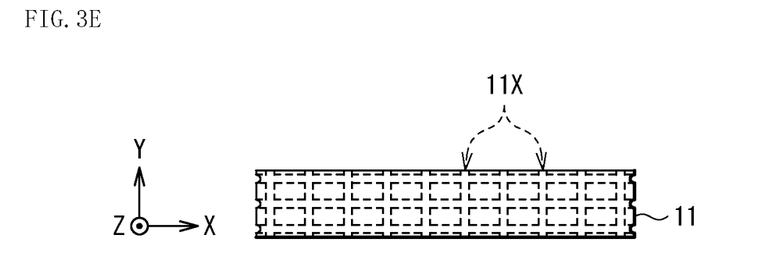
FIG. 3E is a schematic planar diagram illustrating another example of the semiconductor device illustrated in FIG. 1.

As illustrated in FIG. 1, for example, the multiple grooves 11X extend parallel to each other in a normal direction (for example, a Y-axis direction) with respect to the surfaces S1 and S2 opposed to each other. For example, as illustrated in FIG. 2, cross sections of the multiple grooves 11X in a horizontal direction (for example, an XZ-plane direction) with respect to the surface S1 and the surface S2 have a substantially semicircular shape; however, this is non-limiting. As described above, the multiple grooves 11X are for increasing the surface area of the semiconductor device 10, and may thus have, for example, a substantially rectangular cross-sectional shape as illustrated in FIG. 3A or a substantially triangular cross-sectional shape as illustrated in FIG. 3B. Furthermore, while FIG. 1, etc. illustrate an example in which the multiple grooves 11X extend linearly in the Y-axis direction, the direction in which the multiple grooves 11X extend is not limited thereto. For example, the multiple grooves 11X may be grooves meandering in the Y-axis direction as illustrated in FIG. 3C. Further, the multiple grooves 11X may be grooves extending in the horizontal direction (for example, an X-axis direction or a Z-axis direction) with respect to the surface S1 and the surface S2 opposed to each other. Furthermore, the multiple grooves 11X may be formed in a grid shape, for example, as illustrated in FIG. 3E.

It is preferable that the multiple grooves 11X be formed in the whole of the side surface (the surface S3) of the semiconductor substrate 11. Further, it is preferable that the multiple grooves 11X be formed substantially uniformly in a pair of side surfaces opposed to each other, for example, in surfaces S3A and S3B and surfaces 3C and 3D. This brings, for example, a surface tension generated between the surface S3A and a flux 33 and a surface tension generated between the surface S3B and the flux 33 into balance, thus allowing the semiconductor device 10 to sink horizontally into the flux 33 at the time of flux reflow.

(1-2. Method of Manufacturing Semiconductor Device)

Figure 4:
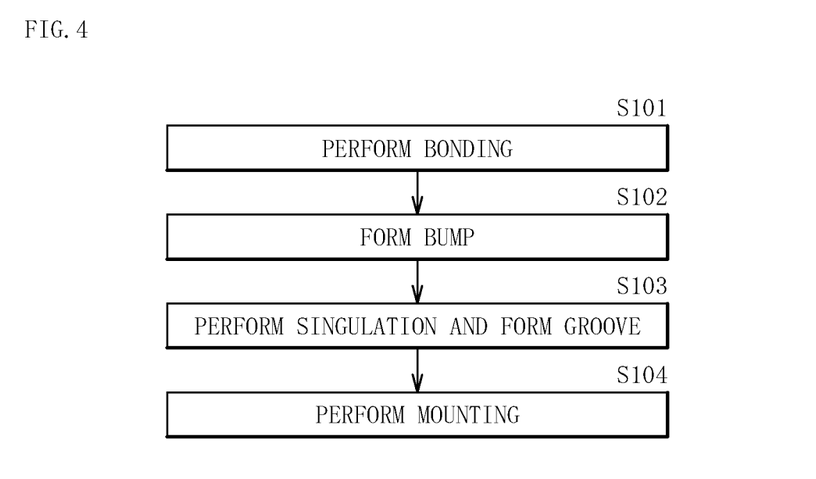
FIG. 4 is a flowchart illustrating steps of manufacturing the semiconductor device illustrated in FIG. 1.

It is possible to manufacture the semiconductor device 10 of the present embodiment in the following manner, for example. FIG. 4 illustrates a flow of steps of manufacturing the semiconductor device 10. FIGS. 5A to 5F illustrate an example of the steps of manufacturing the semiconductor device 10.

Figure 5A:
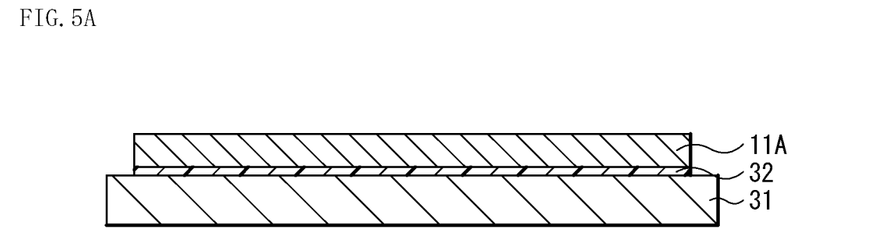
FIG. 5A is a schematic cross-sectional diagram for describing a method of manufacturing the semiconductor device illustrated in FIG. 1.
Figure 5B:
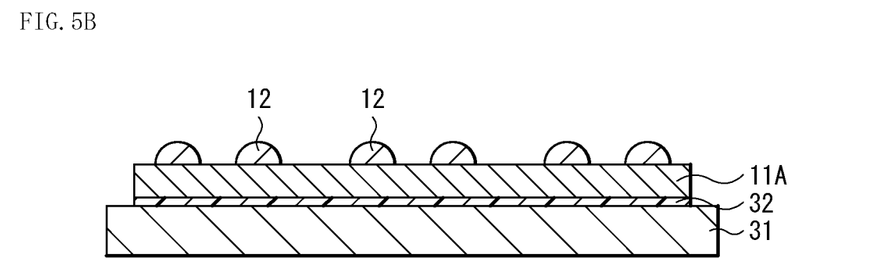
FIG. 5B is a schematic cross-sectional diagram illustrating a step subsequent to FIG. 5A.
Figure 5C:
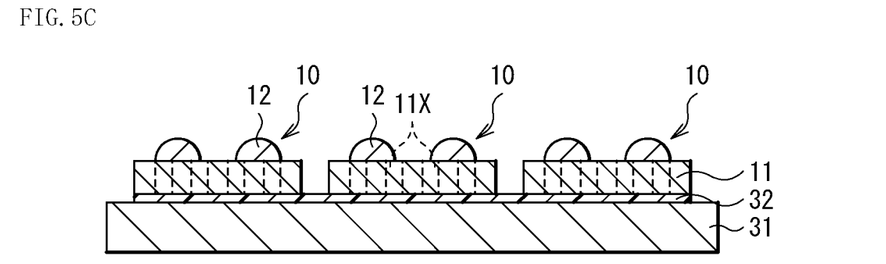
FIG. 5C is a schematic cross-sectional diagram illustrating a step subsequent to FIG. 5B.
Figure 5D:
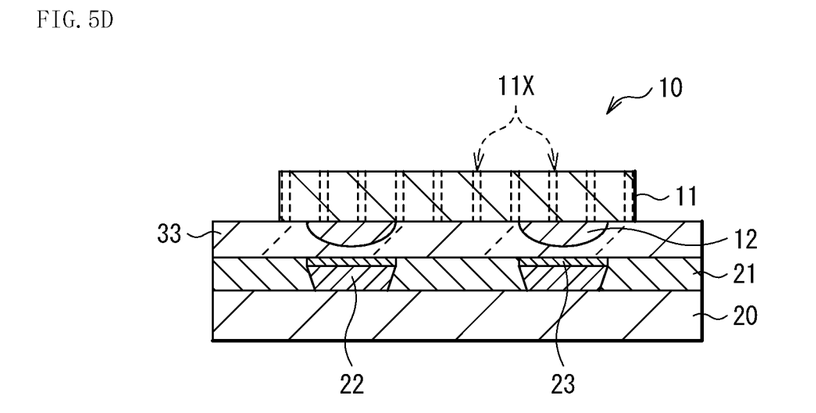
FIG. 5D is a schematic cross-sectional diagram illustrating a step subsequent to FIG. 5C.
Figure 5E:
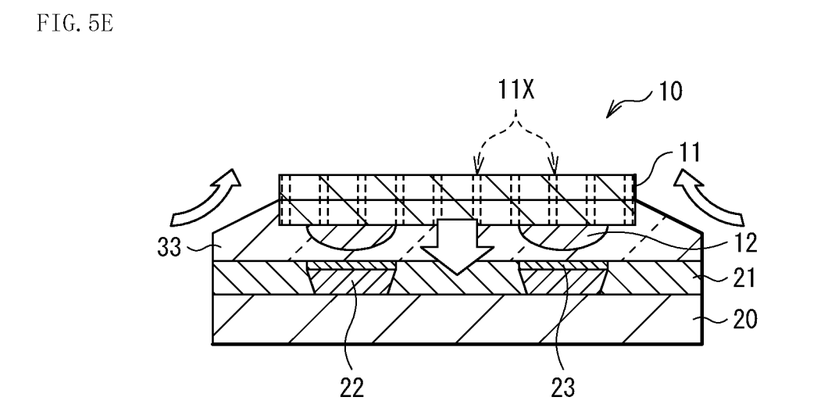
FIG. 5E is a schematic cross-sectional diagram illustrating a step subsequent to FIG. 5D.
Figure 5F:
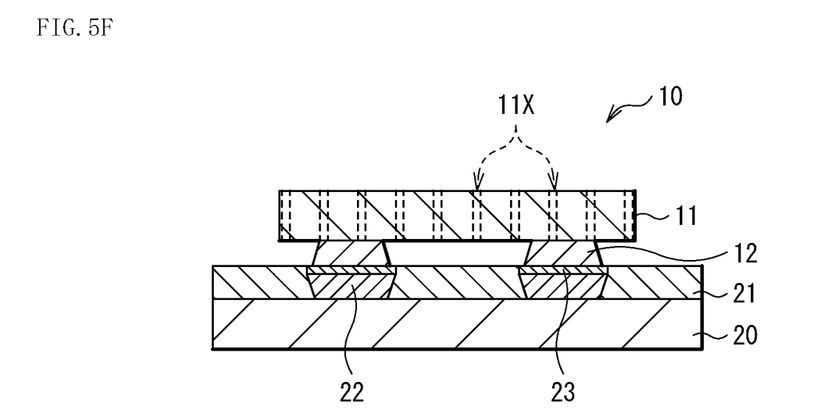
FIG. 5F is a schematic cross-sectional diagram illustrating a step subsequent to FIG. 5E.

First, as illustrated in FIG. 5A, a semiconductor substrate 11A with multiple semiconductor devices 10 provided thereon is bonded onto, for example, a support substrate 31 with an adhesive layer 32 interposed therebetween (step S101). Next, as illustrated in FIG. 5B, the bumps 12 are formed on the semiconductor substrate 11A by plating, for example (step S102). Subsequently, as illustrated in FIG. 5C, the semiconductor substrate 11 is subjected to separation and singulation by dry etching. At the same time, the multiple grooves 11X are formed in the side surface of the semiconductor substrate 11 (step S103). The semiconductor device 10 illustrated in FIG. 1 is thereby completed. Thereafter, as illustrated in FIGS. 5D to 5F, the semiconductor device 10 is mounted onto the mounting substrate 20 (step S104).

The mounting of the semiconductor device 10 onto the mounting substrate 20 is performed in the following manner, for example. First, the mounting substrate 20 is prepared. A wiring layer 21 including the electrode 22 with the antioxidation film 23 stacked on a surface thereof is provided on the mounting substrate 20. As illustrated in FIG. 5D, the flux 33 is applied onto the mounting substrate 20 to have a thickness enough to completely cover the bumps 12 of the semiconductor device 10, following which the semiconductor device 10 is placed on the flux 33. At this time, the flux 33 goes up on the side surface (the surface S3) of the semiconductor substrate 11, as illustrated in FIG. 5E, due to the multiple grooves 11X formed in the side surface (the surface S3) of the semiconductor substrate 11. At the same time, the semiconductor substrate 11 is pulled into the flux 33 by the surface tension, causing the bumps 12 and the electrodes 22 to come into contact with each other. Thereafter, by performing heat treatment, as illustrated in FIG. 5F, the bumps 12 are fused and joined to the electrodes 22. Thereafter, the flux 33 is subjected to a washing step and removed. The mounting of the semiconductor device 10 onto the mounting substrate 20 is thus completed.

It is to be noted that an insulating film may be formed after mounting, as necessary, on a side surface of the semiconductor device 10 (specifically, the side surface (the surface S3) of the semiconductor substrate 11). It is possible to form the insulating film by using, for example, sputtering, ink jet printing, screen printing, or the like. Further, in a case of forming the insulating film on the side surface of the semiconductor device 10, the side surface may be processed into a tapered shape. This makes it possible to easily form the insulating film on the side surface of the semiconductor device 10.

(1-3. Configuration of Semiconductor Unit)

Figure 6:
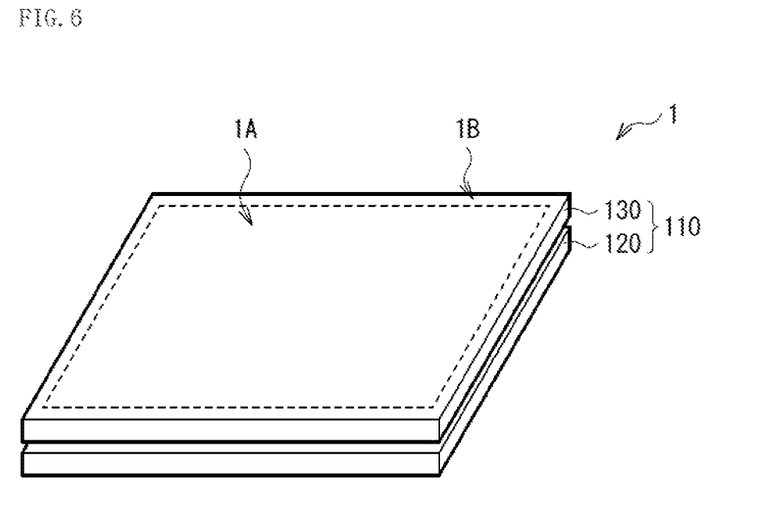
FIG. 6 is a perspective diagram illustrating an example of an overall configuration of a semiconductor unit (an image display unit) illustrated in FIG. 1.

FIG. 6 is a perspective view of an example of a schematic configuration of a display unit 1 as a specific example of the semiconductor unit of the present disclosure. The display unit 1 is a so-called LED display, and uses an LED as a display pixel. As illustrated in FIG. 6, for example, the display unit 1 includes a display panel 110 and a driving circuit (not illustrated) that drives the display panel 110.

The display panel 110 includes a mounting substrate 120 and a transparent substrate 130 laid over each other. A surface of the transparent substrate 130 serves as an image display surface, having a display region 1A in a middle part and a frame region 1B, which is a non-display region, therearound.

Figure 7:
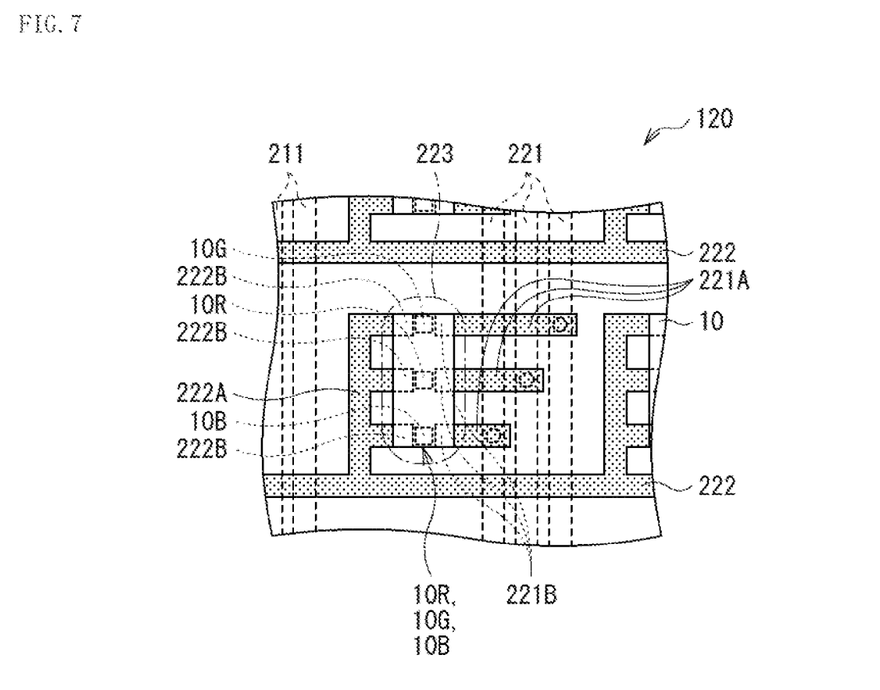
FIG. 7 is a schematic diagram illustrating an example of a wiring layout of the image display unit illustrated in FIG. 6.

FIG. 7 illustrates an example of a layout in a region of a surface of the mounting substrate 120 on side of the transparent substrate 130 corresponding to the display region 1A. In the region of the surface of the mounting substrate 120 corresponding to the display region 1A, as illustrated in FIG. 7, for example, multiple data wiring lines 221 are formed to extend in a predetermined direction and are arranged parallel to each other at predetermined pitches. In the region of the surface of the mounting substrate 120 corresponding to the display region 1A, for example, multiple scan wiring lines 222 are further formed to extend in a direction intersecting (for example, orthogonal to) the data wiring lines 221, and are arranged parallel to each other at predetermined pitches. The data wiring lines 221 and the scan wiring lines 222 include, for example, an electrically-conductive material such as Cu (copper).

The scan wiring lines 222 are formed in an outermost layer, for example. For example, the scan wiring lines 222 are formed on an insulating layer (not illustrated) formed on a surface of a base. It is to be noted that the base of the mounting substrate 220 includes, for example, a glass substrate, a resin substrate, or the like. The insulating layer on the base includes, for example, $SiN_x$, $SiO_x$, or $Al_xO_y$. In contrast, the data wiring lines 221 are formed in a layer (for example, a layer below the outermost layer) different from the outermost layer including the scan wiring lines 222. For example, the data wiring lines 221 are formed in the insulating layer provided on the base. In addition to the scan wiring lines 222, for example, a black is provided on a surface of the insulating layer, as necessary. The black is for enhancing the contrast, and includes a light-absorbing material. The black is formed at least in a region of the surface of the insulating layer in which pad electrodes 221B and 222B described later are not formed, for example. It is to be noted that the black may be omitted, as necessary.

Display pixels 223 are provided in the vicinity of intersections between the data wiring lines 221 and the scan wiring lines 222. The multiple display pixels 223 are arranged in a matrix in the display region 1A. A light emitting unit including multiple light emitting devices is mounted on each of the display pixels 223. It is to be noted that in FIG. 7, a single display pixel 223 includes three light emitting devices corresponding to R, G, and B.

Figure 8:
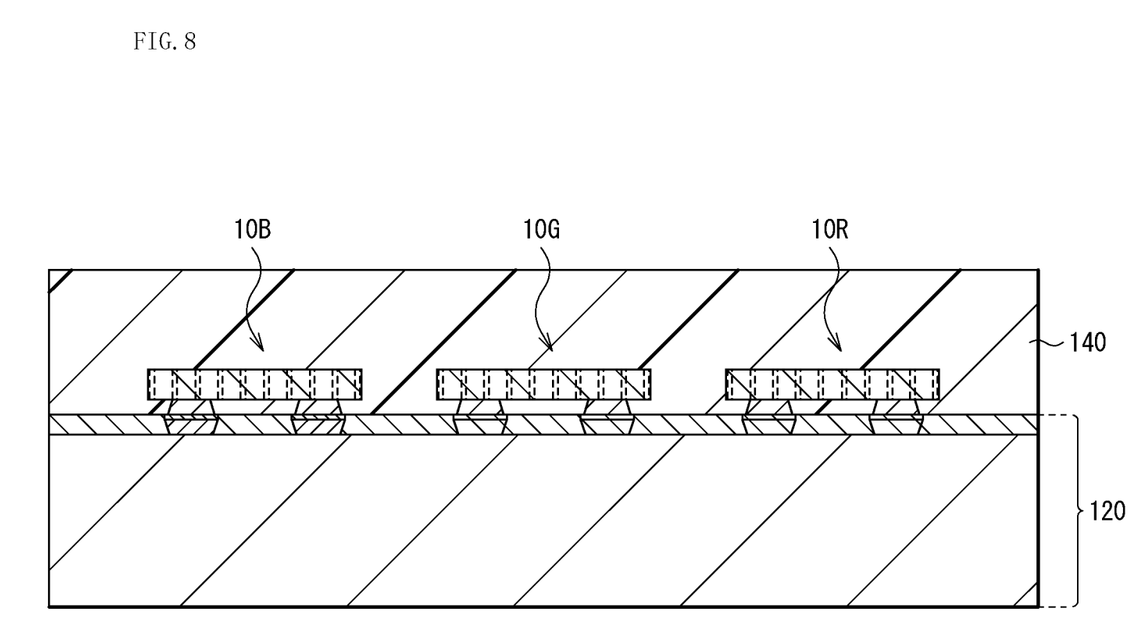
FIG. 8 is a schematic cross-sectional diagram illustrating an example of a configuration of a mounting substrate illustrated in FIG. 6.

FIG. 8 schematically illustrates a cross-sectional configuration of the mounting substrate 120 illustrated in FIG. 6. As the light emitting devices described above, three semiconductor devices 10R, 10G, and 10B, for example, are mounted on the mounting substrate 120.

The semiconductor devices 10R, 10G, and 10B are arranged in a row with a predetermined gap therebetween. The gap between adjacent ones of the semiconductor devices 10R, 10G, and 10B is equivalent to or narrower than the size of each of the semiconductor devices 10R, 10G, and 10B, for example. It is to be noted that in some cases, the gap described above may be greater than the size of each of the semiconductor devices 10.

The semiconductor devices 10R, 10G, and 10B used as the light emitting devices are configured to emit pieces of light having wavelengths different from each other. For example, the semiconductor device 10R is configured to emit light of a red band (Lr), the semiconductor device 10G is configured to emit light of a green band (Lg), and the semiconductor device 10B is configured to emit light of a blue band (Lb). The semiconductor devices 10R, 10G, and 10B may be sealed into a single package by, for example, a sealing resin 140, and may take a form mountable on the mounting substrate 120. The sealing resin 140 corresponds to a specific example of a "sealing member" of the present disclosure.

(1-4. Workings and Effects)

As described above, in chip mounting by flux reflow, the chip sinks into the flux under its own weight, causing a solder on the chip side and an UBM on the substrate side to come into contact with each other. The solder on the chip side and the UBM on the substrate side are fusion-coupled to each other by being subjected to heat treatment in a state where they are in contact with each other.

However, in a case where, for example, a chip that is made finer to have a side length of 500 μm or less (hereinafter, referred to as a microchip) is intended to be mounted by flux reflow, the microchip fails to sink into the flux under its own weight as described above, and floats. When in this state, a solder on the microchip side and the UBM on the substrate side fail to come into contact with each other. This results in faulty coupling, and thus reduces the manufacturing yield.

To cope with this, in the present embodiment, the surface tension on the side surface of the semiconductor device 10 is controlled. Specifically, the multiple grooves 11X are formed as a projection-and-depression structure in the side surface of the semiconductor device 10 (specifically, the side surface (the surface S3) of the semiconductor substrate 11).

Figure 12:
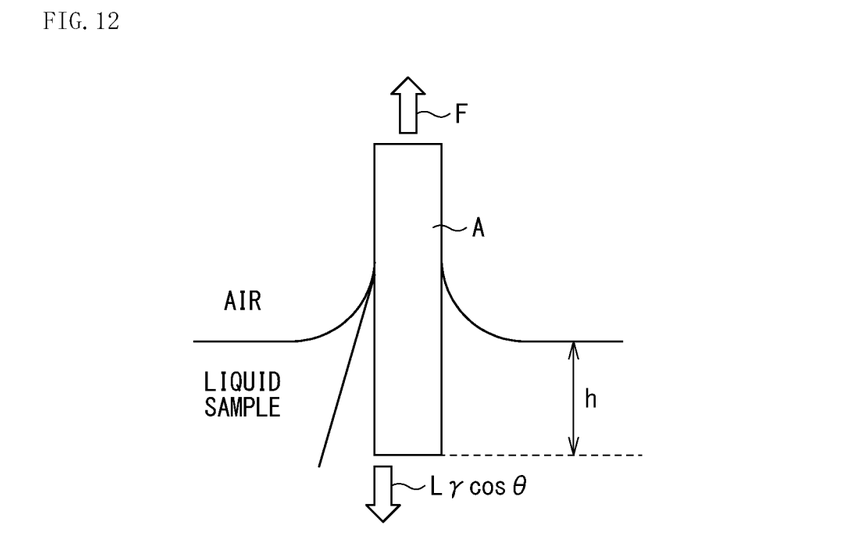
FIG. 12 is a diagram describing a principle of the present technology.

FIG. 12 is a diagram for describing the principle of the present technology. A contact angle (a dynamic contact angle) in a dynamic state in which an interface between a liquid and an object (a solid object) moves is measurable by using, for example, a Wilhelmy method (a plate method or a vertical plate method). When a liquid sample comes into contact with a surface of a solid sample A, the liquid wets the solid sample A upwards. At this time, the surface tension acts along a perimeter of the solid sample A to pull the solid sample A into the liquid. A force ($L\gamma \cos \theta$) pulling the solid sample A into the liquid is represented by the following equation (1), for example. From the following equation (1), it is seen that the force ($L\gamma \cos \theta$) pulling the solid sample A into the liquid increases as a perimeter length (L) of the solid sample increases.

$$\text{(Mathematical Equation)} \quad F = L\gamma \cos \theta - Sh\rho g \tag{1}$$

θ: Contact angle between the solid sample and the liquid sample
F: Measured force (the force acting on the solid sample)
S: Cross-sectional area of the solid sample
h: Immersion distance of the solid sample
ρ: Density of the liquid sample
L: Perimeter length of the solid sample
γ: Surface tension As described above, in the semiconductor device 10 of the present embodiment, the multiple grooves 11X are provided in the side surface (the surface S3) of the semiconductor substrate 11. This makes it easier for the flux 33 to go up on the side surface (the surface S3) of the semiconductor substrate 11. The force pulling the semiconductor device 10 into the flux 33 thus increases, and assists the bump 12 on side of the semiconductor device 10 in coming into contact with the electrode 22 on side of the mounting substrate 20 under its own weight. This reduces faulty coupling at the time of mounting, thus making it possible to improve the manufacturing yield.

Figure 9:
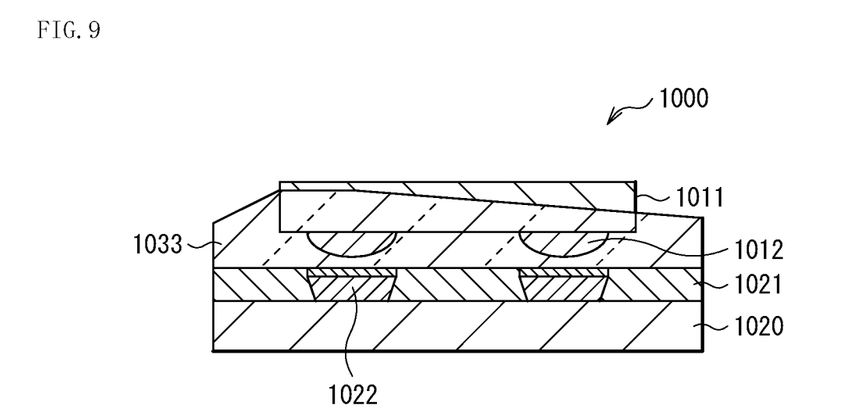
FIG. 9 is a schematic cross-sectional diagram describing a step of mounting a semiconductor device as a reference example.
Figure 10:
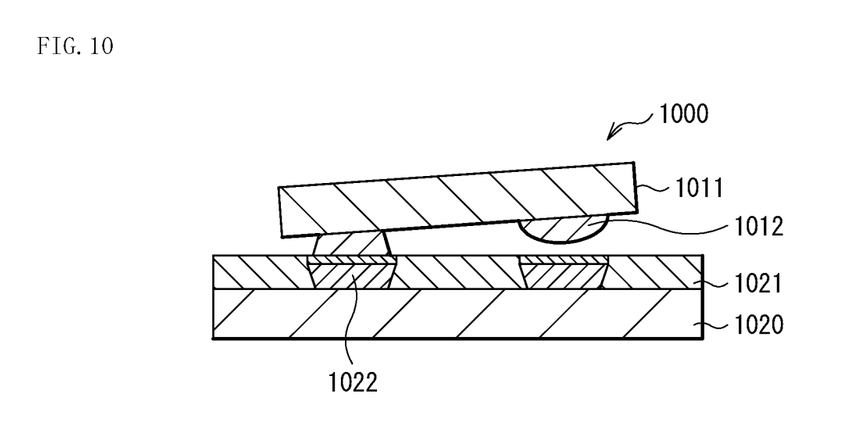
FIG. 10 is a schematic cross-sectional diagram illustrating an example of a state of the semiconductor device and the mounting substrate having undergone the step of mounting illustrated in FIG. 9.
Figure 11:
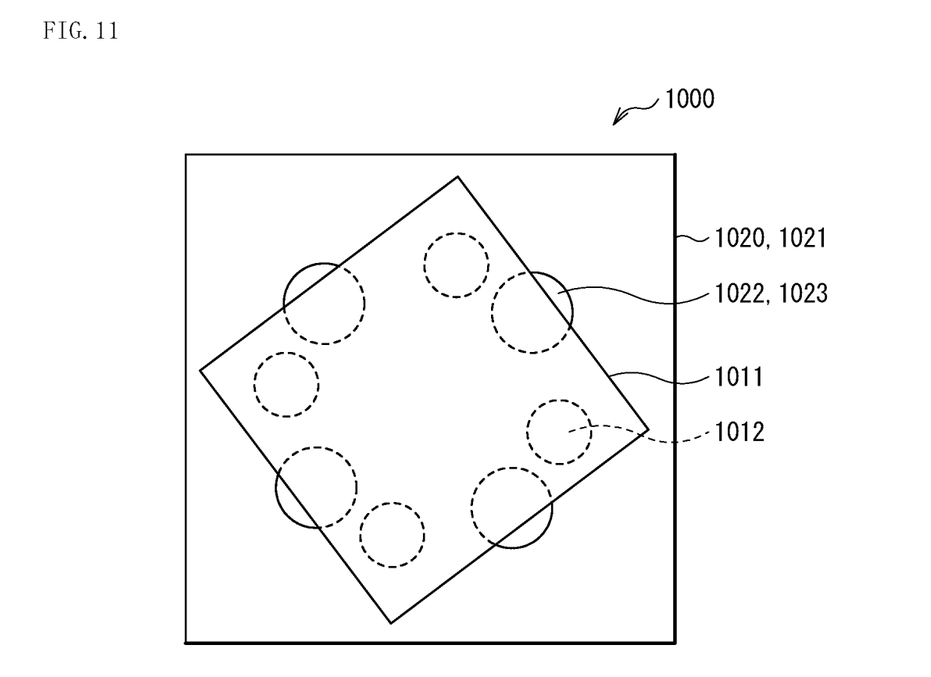
FIG. 11 is a schematic cross-sectional diagram illustrating another example of the state of the semiconductor device and the mounting substrate having undergone the step of mounting illustrated in FIG. 9.

Further, the flux sometimes goes up on a side surface of a microchip. For example, in a microchip 1000, as illustrated in FIG. 9, the flux sometimes goes up only on a portion of the side surface of a semiconductor substrate 1011. As a result, fusion coupling occurs only between some solders on side of the microchip 100 and some electrodes 1022 embedded in a wiring layer 1021 provided on a mounting substrate 1020. This causes faulty coupling such as a Manhattan phenomenon where one side of the microchip 1000 rises as illustrated in FIG. 10, or a rotational misalignment of the microchip 1000 as illustrated in FIG. 11.

To cope with this, in the present embodiment, the multiple grooves X are formed substantially uniformly in at least a pair of side surfaces opposed to each other, for example, in the surfaces S3A and S3B and the surfaces 3C and 3D, and more preferably, the multiple grooves X are formed in the whole of the side surface (the surface S3) of the semiconductor substrate 11. This allows the semiconductor device 10 to sink horizontally into the flux 33. Accordingly, the faulty coupling described above is reduced, and it becomes possible to further improve the manufacturing yield. In addition, a step of repairing the faulty coupling is obviated, and it is thus possible to reduce the manufacturing cost.

2. Modification Example

Figure 13:
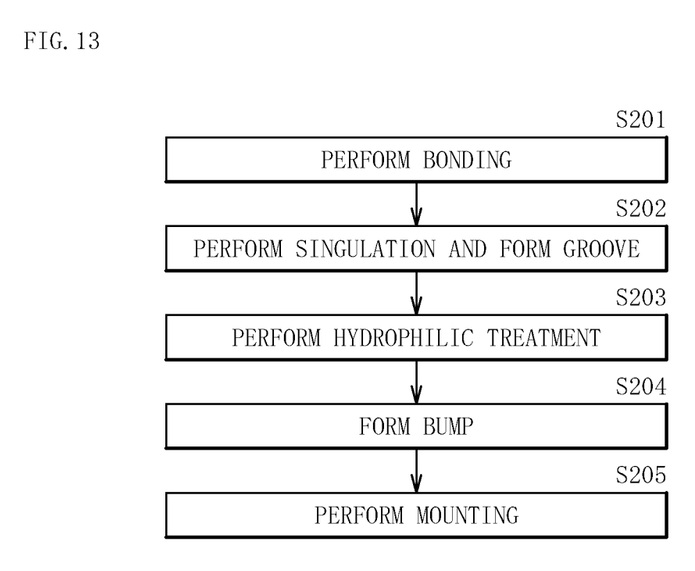
FIG. 13 is a flowchart illustrating steps of manufacturing a semiconductor device according to a modification example of the present disclosure.

FIG. 13 illustrates a flow of steps of manufacturing a semiconductor device (semiconductor device 10) according to a modification example of the present disclosure. The side surface (the surface S3) of the semiconductor substrate 11 included in the semiconductor device 10 may have a hydrophilic property. In that case, it is possible to manufacture the semiconductor device 10 in the following manner, for example.

First, similarly to the foregoing embodiment, the semiconductor substrate 11A with the multiple semiconductor devices 10 provided thereon is bonded onto, for example, the support substrate 31 with the adhesive layer 32 interposed therebetween (step S201). Next, the semiconductor substrate 11 is subjected to separation and singulation by dry etching. At the same time, the multiple grooves 11X are formed in the side surface of the semiconductor substrate 11 (step S202). Subsequently, a hydrophilic treatment is performed on the side surface of the singulated semiconductor device 10 (step S203). The hydrophilic treatment may be performed by, for example, plasma ashing or the like. Next, the bumps 12 are formed on the semiconductor substrate 11A by plating, for example (step S204). The semiconductor device 10 with its side surface hydrophilic-treated is completed.

As described above, by subjecting the side surface of the semiconductor substrate 11 to a hydrophilic treatment, a surface tension with the flux 33 is effectively generated at the time of mounting, and it thus becomes possible to further reduce the faulty coupling between the bump 12 on side of the semiconductor device 10 and the electrode 22 on side of the mounting substrate 20. That is, it becomes possible to further improve the manufacturing yield.

The description has been given above with reference to the embodiment and the modification example; however, the contents of the present disclosure are not limited to the foregoing embodiment and the like, and may be modified in a variety of ways. For example, in the foregoing embodiment, the light emitting device (the LED chip) has been described as a specific example of the semiconductor device 10; however, the semiconductor device of the present disclosure may be a sensor device, a light receiving element, or the like, for example. Further, for example, an integrated circuit (IC) or the like may be formed.

It is to be noted that the present disclosure may have the following configurations. According to the present technology having the following configurations, the projection-and-depression structure is formed by dry etching in the side surface of a package substrate provided with semiconductor elements, and therefore the surface tension on the side surface of the package substrate is increased. This assists the semiconductor device in coming into contact with the mounting substrate under its own weight, thus making it possible to improve the manufacturing yield. It is to be noted that the effects described here are not necessarily limiting, and may be any of the effects described in the present disclosure.

(1)
A semiconductor device including:
a semiconductor substrate having one surface and another surface opposed to each other, and having a side length of 50 μm or more and 500 μm or less;

a single or multiple bumps provided on the other surface; and a projection-and-depression structure formed in a side surface of the semiconductor substrate.

(2)

The semiconductor device according to (1), in which the projection-and-depression structure is formed in a whole of the side surface of the semiconductor substrate.

(3)

The semiconductor device according to (1) or (2), in which the semiconductor substrate has, as the projection-and-depression structure, multiple grooves extending in a normal direction with respect to the one surface and the other surface.

(4)

The semiconductor device according to (3), in which the multiple grooves are formed substantially uniformly at least in a pair of side surfaces opposed to each other.

(5)

The semiconductor device according to (3) or (4), in which the multiple grooves have a cross-sectional shape that is substantially semicircular, substantially rectangular, or substantially triangular with respect to a horizontal direction of the one surface and the other surface.

(6)

The semiconductor device according to any one of (1) to (5), in which the side surface of the semiconductor substrate has a hydrophilic property.

(7)

The semiconductor device according to any one of (1) to (6), in which the side length of the semiconductor substrate is 80 µm or more and 200 µm or less.

(8)

A semiconductor device including:
a semiconductor substrate having one surface and another surface opposed to each other;
a single or multiple bumps provided on the other surface; and
a projection-and-depression structure formed by dry etching in a side surface of the semiconductor substrate.

(9)

A semiconductor unit including multiple semiconductor devices mounted on a mounting substrate,
in which the semiconductor devices each include:
a semiconductor substrate having one surface and another surface opposed to each other, and having a side length of 50 µm or more and 500 µm or less;
a single or multiple bumps provided on the other surface; and
a projection-and-depression structure formed in a side surface of the semiconductor substrate.

(10)

The semiconductor unit according to (9), further including a sealing member on the mounting substrate,
in which the semiconductor devices are sealed by the sealing member.

(11)

A semiconductor unit including multiple semiconductor devices mounted on a mounting substrate,
in which the semiconductor devices each include:
a semiconductor substrate having one surface and another surface opposed to each other;
a single or multiple bumps provided on the other surface; and
a projection-and-depression structure formed by dry etching in a side surface of the semiconductor substrate.

This application claims priority from Japanese Patent Application No. 2019-027481 filed with the Japan Patent Office on Feb. 19, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device, comprising:
a semiconductor substrate having one surface and another surface opposed to each other;
a single or multiple bumps provided on the other surface; and
a projection-and-depression structure formed in a side surface of the semiconductor substrate, wherein the side surface of the semiconductor substrate has a hydrophilic property.

2. The semiconductor device according to claim 1, wherein the projection-and-depression structure is formed in a whole of the side surface of the semiconductor substrate.

3. The semiconductor device according to claim 1, wherein the semiconductor substrate has, as the projection-and-depression structure, multiple grooves extending in a normal direction with respect to the one surface and the other surface.

4. The semiconductor device according to claim 3, wherein the multiple grooves are formed substantially uniformly at least in a pair of side surfaces opposed to each other.

5. The semiconductor device according to claim 3, wherein the multiple grooves have a cross-sectional shape that is substantially semicircular, substantially rectangular, or substantially triangular with respect to a horizontal direction of the one surface and the other surface.

6. The semiconductor device according to claim 1, wherein a side length of the semiconductor substrate is 80 µm or more and 200 µm or less.

7. A semiconductor unit comprising multiple semiconductor devices mounted on a mounting substrate,
wherein the semiconductor devices each include:
a semiconductor substrate having one surface and another surface opposed to each other, and having a side length of 50 µm or more and 500 µm or less;
a single or multiple bumps provided on the other surface; and
a projection-and-depression structure formed in a side surface of the semiconductor substrate, wherein the side surface of the semiconductor substrate has a hydrophilic property.

8. The semiconductor unit according to claim 7, further comprising a sealing member on the mounting substrate,
wherein the semiconductor devices are sealed by the sealing member.

9. A semiconductor unit comprising multiple semiconductor devices mounted on a mounting substrate,
wherein the semiconductor devices each include:
a semiconductor substrate having one surface and another surface opposed to each other;
a single or multiple bumps provided on the other surface; and
a projection-and-depression structure formed by dry etching in a side surface of the semiconductor substrate, wherein the side surface of the semiconductor substrate has a hydrophilic property.

10. The semiconductor unit according to claim 9, further comprising a sealing member on the mounting substrate,
wherein the semiconductor devices are sealed by the sealing member.

11. The semiconductor unit according to claim 9, wherein the semiconductor substrate has, as the projection-and-depression structure, multiple grooves extending in a normal direction with respect to the one surface and the other surface, wherein the multiple grooves have a cross-sectional shape that is substantially semicircular, substantially rectangular, or substantially triangular with respect to a horizontal direction of the one surface and the other surface.

12. The semiconductor device according to claim 1, wherein the semiconductor substrate has a side length of 50 μm or more and 500 μm or less.

13. The semiconductor unit according to claim 7, wherein the projection-and-depression structure is formed by dry etching in a side surface of the semiconductor substrate.

14. The semiconductor unit according to claim 7, wherein the semiconductor substrate has, as the projection-and-depression structure, multiple grooves extending in a normal direction with respect to the one surface and the other surface, wherein the multiple grooves have a cross-sectional shape that is substantially semicircular, substantially rectangular, or substantially triangular with respect to a horizontal direction of the one surface and the other surface.

\* \* \* \* \*